United States Patent
Le Guillou

(10) Patent No.: US 9,325,927 B2
(45) Date of Patent: Apr. 26, 2016

(54) METHOD OF OPERATING A MULTI-STREAM RECEPTION SCHEME

(75) Inventor: Yann Le Guillou, Caen (FR)

(73) Assignee: NXP B.V., Eindhoven (NL)

( * ) Notice: Subject to any disclaimer, the term of this patent is extended or adjusted under 35 U.S.C. 154(b) by 902 days.

(21) Appl. No.: 12/865,991

(22) PCT Filed: Feb. 3, 2009

(86) PCT No.: PCT/IB2009/050440
§ 371 (c)(1),
(2), (4) Date: Aug. 3, 2010

(87) PCT Pub. No.: WO2009/098642
PCT Pub. Date: Aug. 13, 2009

(65) Prior Publication Data
US 2011/0002424 A1    Jan. 6, 2011

(30) Foreign Application Priority Data
Feb. 7, 2008 (EP) .................................... 08101383

(51) Int. Cl.
*H04B 1/06* (2006.01)
*H04N 5/455* (2006.01)
*H03L 7/197* (2006.01)
*H03L 7/23* (2006.01)
(Continued)

(52) U.S. Cl.
CPC .............. *H04N 5/455* (2013.01); *H03L 7/1976* (2013.01); *H03L 7/23* (2013.01); *H04N 21/6118* (2013.01); *H04N 21/4263* (2013.01); *H04N 21/42676* (2013.01)

(58) Field of Classification Search
USPC ........................................ 455/180.3, 259–260
See application file for complete search history.

(56) References Cited

U.S. PATENT DOCUMENTS 5,966,646 A * 10/1999 Lampe .................. H03D 7/163
375/347
6,321,074 B1  11/2001 Lemay
(Continued)

FOREIGN PATENT DOCUMENTS

CN            1 992 839 A      7/2007
JP        2004-361863    *    6/2006 ............... H04B 1/26
(Continued)

OTHER PUBLICATIONS

Wikipedia entry for "Docsis", http://en.wikipedia.org/wiki/DOCSIS, 4 pgs. (Jan. 30, 2008).
(Continued)

*Primary Examiner* — Edward Urban
*Assistant Examiner* — Mohammed Rachedine

(57) ABSTRACT

A method of operating a multi-stream reception scheme, such as DOCSIS (Data Over Cable Service Interface Specifications), comprising at least two receivers (10, 12, 14) having respective voltage controlled oscillators (16), the method including monitoring a change in local oscillator frequency in a selected one of the at least two streams and, if the frequency distance between the local oscillator frequencies is below a value likely to cause pulling or coupling between the voltage controlled oscillators of the at least two receivers, resetting the frequency planning of the selected one of the at least two streams to maximize the frequency distance of the voltage controlled oscillator of the selected stream with the voltage controlled oscillators of the or the other streams.

20 Claims, 6 Drawing Sheets

Figure 1:
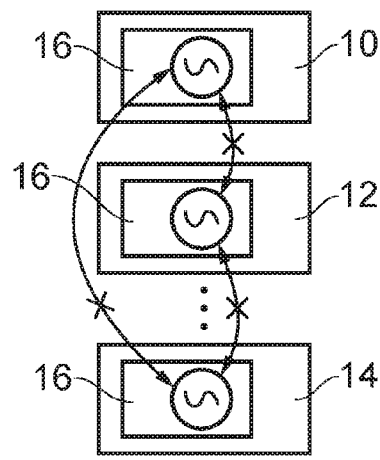

(51) Int. Cl.
*H04N 21/61* (2011.01)
*H04N 21/426* (2011.01)

(56) References Cited

U.S. PATENT DOCUMENTS

| | | | |
|---|---|---|---|
| 6,441,857 B1* | 8/2002 | Wicker et al. | 348/441 |
| 2002/0039894 A1* | 4/2002 | Yoshida | H04B 1/405 |
| | | | 455/265 |
| 2005/0151592 A1* | 7/2005 | Partridge et al. | 331/16 |
| 2006/0258299 A1* | 11/2006 | Widerin | H03B 21/02 |
| | | | 455/76 |

FOREIGN PATENT DOCUMENTS

| | | |
|---|---|---|
| JP | 2006-173922 A | 6/2006 |
| JP | 2006173922 A * | 6/2006 |
| KR | 100 837 115 B1 | 6/2008 |

OTHER PUBLICATIONS

International Search Report and Written Opinion for Int'l. Patent Appln. No. PCT/IB2009/050440 (Feb. 3, 2009).

\* cited by examiner

US 9,325,927 B2

METHOD OF OPERATING A MULTI-STREAM RECEPTION SCHEME

The present invention relates to a method of operating a multi-stream reception scheme. The present invention has particular, but not exclusive application in apparatus for use in Data Over Cable Service Interface Specifications (DOCSIS) applications.

For convenience of in the following description the TV channel bandwidths will be referred to the North-America NTSC standard of 6 MHz but the present invention can be adapted to conform to other bandwidth standards such as the European cable PAL TV standard which specifies 8 MHz channel bandwidth.

Over the recent years, the television market has seen an increasing adoption of multi-stream. A typical application is a "watch and record" feature for Set-Top-Boxes (STB) and PC-TV cards. A relatively new application is the use of so-called bonded channels for increasing data rates in cable modem applications. In bonded channels the data streams of multiple channels are combined to a single high data rate stream. The DOCSIS3.0 AND DOCSIS4.0 standards are dedicated for these kinds of applications. With all such miniaturised broadband TV receivers which are integrated on the same die, the issue of VCO pulling becomes increasingly important, that is the simultaneous operation of those receivers affecting the performance of individual devices to a point where reception quality becomes unacceptable. Therefore, the multi-stream TV receiver is likely to be de-sensed when the oscillators are pulling each other.

An object of the present invention is to avoid frequency pulling in multi-stream receivers.

According to a first aspect of the present invention there is provided a method of operating a multi-stream reception scheme comprising at least two receivers having respective voltage controlled oscillators (VCOs), the method including monitoring a change in local oscillator frequency in a selected one of the at least two streams and, if the frequency distance between the local oscillator frequencies of the streams is below a value likely to cause pulling or coupling between the VCOs of the at least two receivers, resetting the frequency planning of the selected one of the at least two streams to maximise the frequency distance of the VCO of the selected stream with the VCOs of the or the other streams.

According to a second aspect of the present invention there is provided an apparatus suitable for operating a multi-stream reception scheme, the apparatus comprising at least two receivers having respective voltage controlled oscillators (VCOs), and means for monitoring a change in local oscillator frequency in a selected one of the at least two streams and, if the frequency distance between the local oscillator frequencies of the streams is below a value likely to cause pulling or coupling between the VCOs of the at least two receivers, and for resetting the frequency planning of the selected one of the at least two streams to maximise the frequency distance of the VCO of the selected stream with the VCOs of the or the other streams.

If desired the offset frequency may be generated by dividing the second VCO frequency. Alternatively the offset frequency may be generated by an offset PLL. Such an alternative arrangement has the advantage that spurs and noise of the offset frequency and the channel frequency are uncorrelated, The second VCO frequency may be selected to maximise the frequency difference between its frequency and the first VCO frequency and to produce the desired offset frequency.

According to a third aspect of the present invention there is provided a multi-stream reception system in which transmissions are made on one or more of a plurality of streams having predetermined channel frequencies, the system comprising at least one receiving means having a plurality of simultaneously operating receivers coupled to a common reference signal source, a first receiver of the plurality of the receivers having, for a first stream, means to set the frequency of a first voltage controlled oscillator (VCO) to a value which can be used to produce a first local oscillator frequency for demodulating the channel frequency of the first stream, and a second receiver of the plurality of the receivers having, for a second stream, means to set the frequency of a second voltage controlled oscillator (VCO) to a value which can be used to produce a second local oscillator frequency for demodulating another one of the channel frequencies, the receiving means having means for monitoring a local oscillator frequency change between the first local oscillator frequency and the second local oscillator signal and determining if the change in frequency is likely to cause the second VCO to interfere with the first VCO, and, in response to determining that there is a risk of interference, to reset the second VCO frequency to maximize the frequency distance with at least the first VCO.

Figure 2:
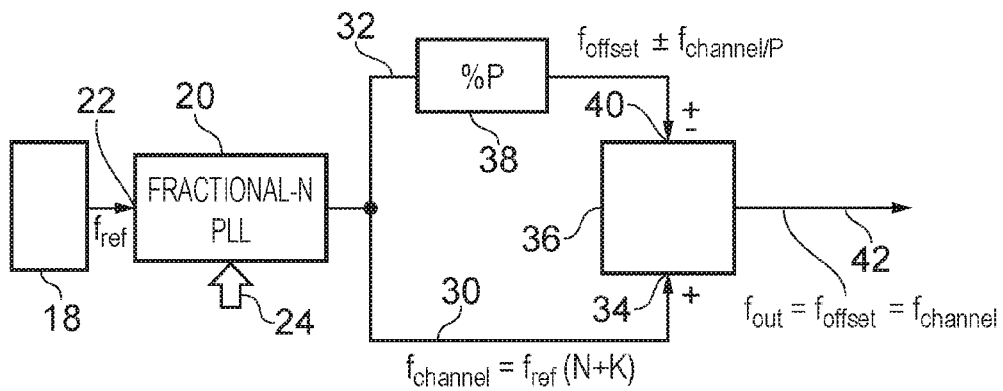
Figure 3:
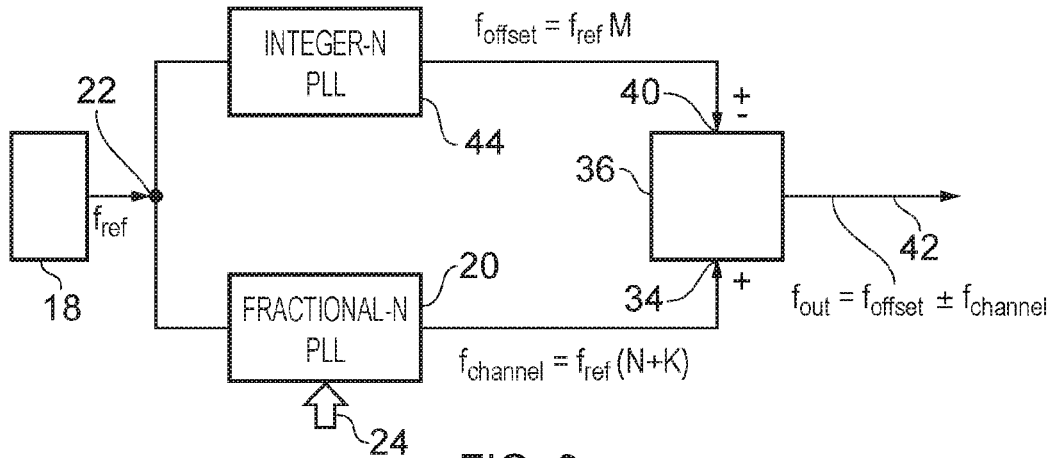
Figure 4:
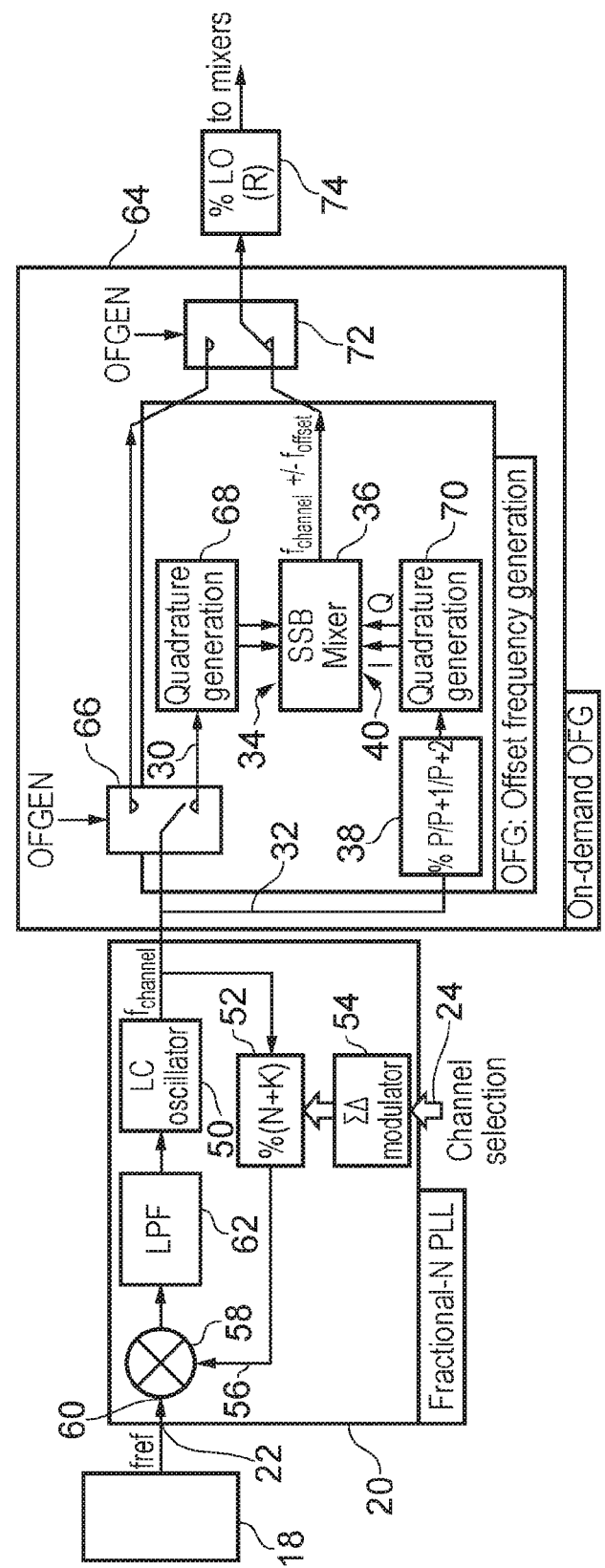
Figure 5A:
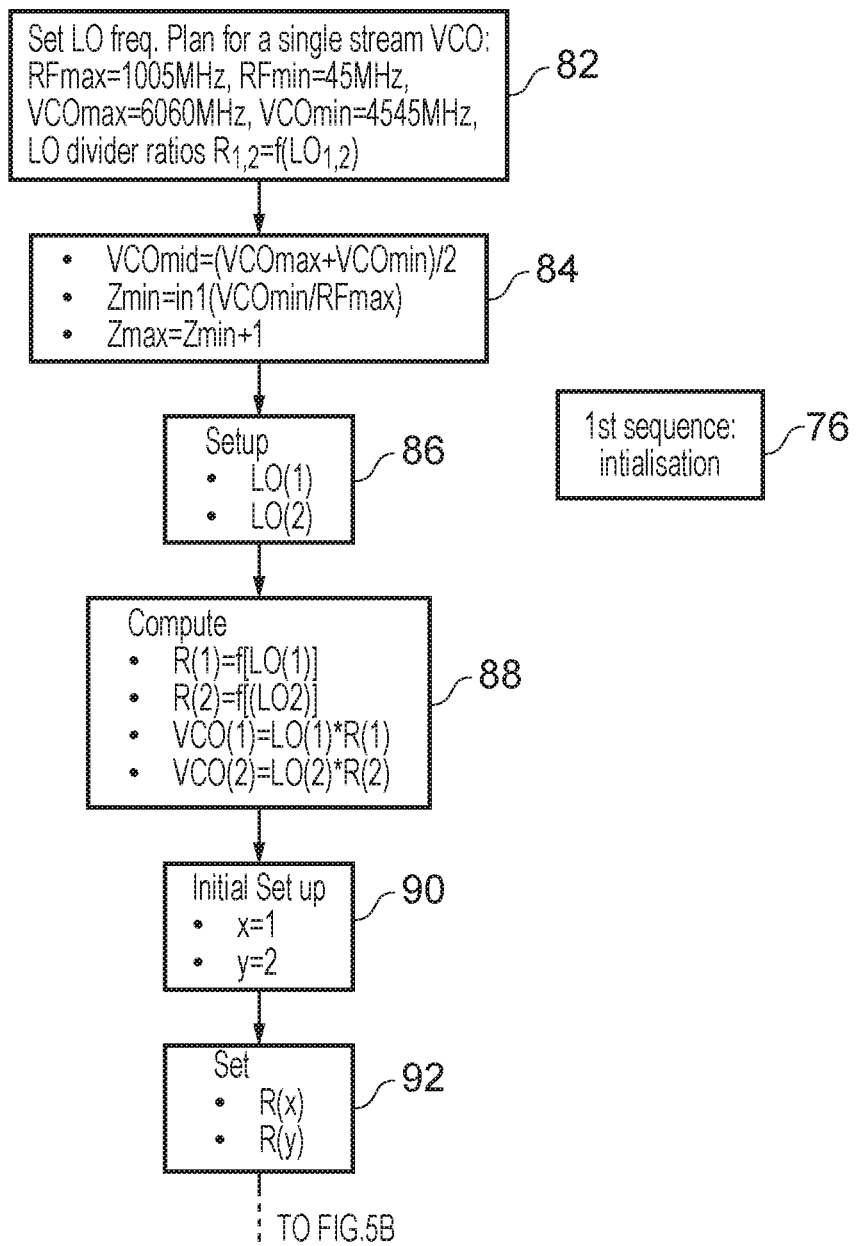
Figure 5B:
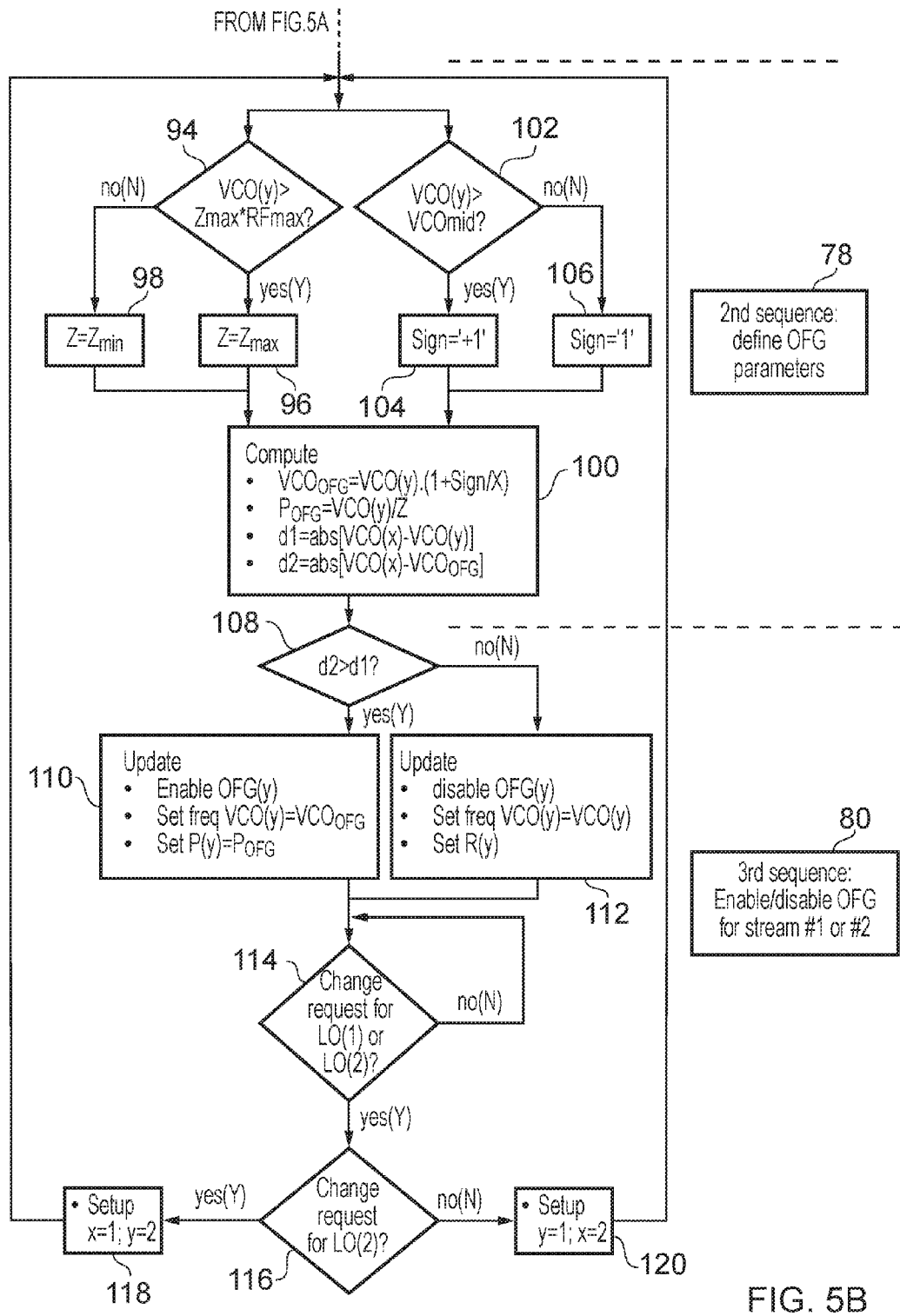
Figure 6:
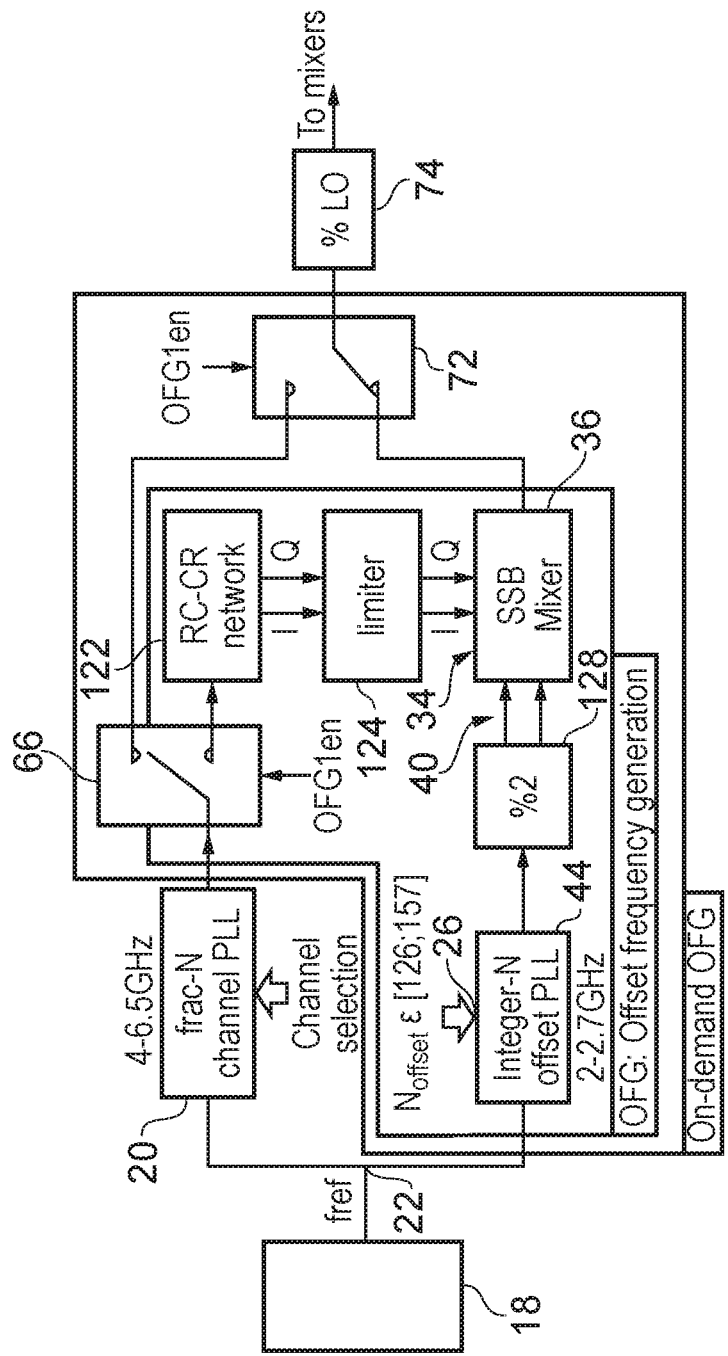
Figure 7:
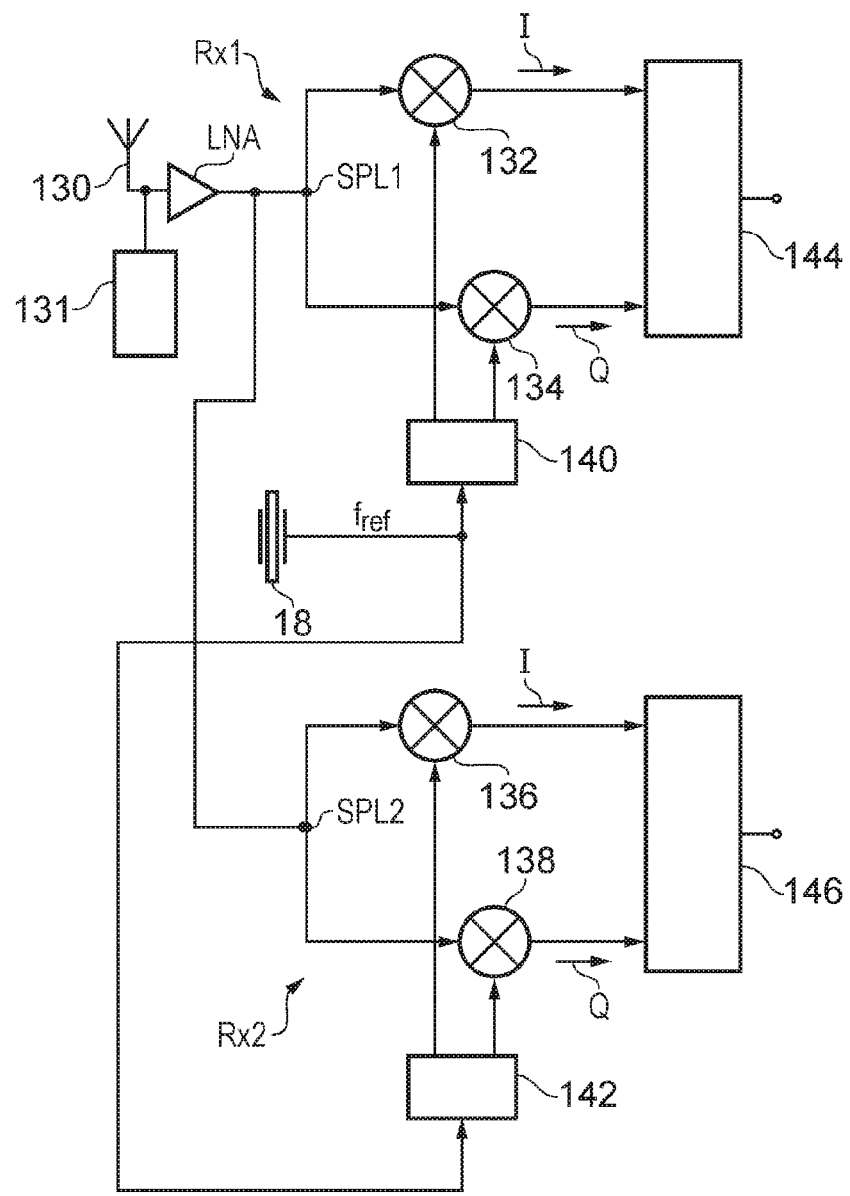

The present invention will now be explained and described, by way of example, with reference to the accompanying drawings, wherein:

FIG. 1 is a block schematic diagram illustrating the problem of oscillator pulling in a broadband TV receiver, FIG. 2 is a block schematic diagram of a first architecture for providing an offset frequency, FIG. 3 is a block schematic diagram of a second architecture for providing an offset frequency, FIG. 4 illustrates one embodiment of the offset frequency generator made in accordance with the present invention, FIGS. 5A and 5B are a flow chart of an algorithm for dual stream reception FIG. 6 illustrates a second of the offset frequency generator made in accordance with the present invention, and FIG. 7 is a simplified block schematic diagram of a receiver made in accordance with the present invention.

In the drawings the same reference numerals have been used to indicate corresponding features.

The illustrated multiband TV receiver shown in FIG. 1 comprises receiver streams 10, 12, 14, each receiver stream having its own inductance-capacitance voltage controlled oscillator (LC-VCO) 16. The double headed arrows illustrate the interaction between the LC-VCOs which lead to oscillator pulling causing degradation in the frequencies generated. A way of reducing, if not eliminating, the oscillator pulling is to maximize the frequency distance between the LC-VCOs 16 thereby avoiding the interaction. A method of increasing the frequency distance is to produce a frequency offset between each of the oscillators in the respective receiver streams 10, 12 and 14.

FIG. 2 illustrates a first architecture for providing an offset frequency. A fractional-N phase locked loop (PLL) 20 has an input 22 for a reference frequency $f_{ref}$ derived from a stable frequency source 18, such as a crystal oscillator, and another input 24 for a channel selection indication in the form of a digital word. The PLL 20 produces the channel frequency $f_{channel}=f_{ref}(N+K)$, where K is a fractional value on an output 26. The output from the PLL 20 is divided into two paths 30, 32. The path 30 is coupled to an input 34 of a single sideband (SSB) mixer 36 which functions as a frequency adder. The path 32 includes a frequency divider 38 which produces an offset frequency $f_{offset}=f_{channel}/P$, where P is a divider. An output from the frequency divider 38 is coupled to an input 40 of the SSB mixer 36. An output 42 of the SSB mixer 36 comprises $f_{out}$ which consists of $f_{offset} \pm f_{channel}$. The input 40 of the SSB mixer 36 may be an inverting or non-inverting input depending on whether the offset frequency is to be subtracted or added to the channel frequency.

FIG. 3 illustrates a second architecture in which the offset frequency is derived using a separate integer-N PLL 44. The reference frequency $f_{ref}$ is supplied simultaneously to the fractional-N PLL 20 which provides the channel frequency $f_{channel}$ and to the integer-N PLL 44 which provides the offset frequency $f_{offset}$. The PLL 20 output $f_{channel}=f_{ref} \cdot (N+K)$ is supplied to the input 34 of the SSB mixer 36 functioning as a frequency adder. The PLL 44 offset frequency $f_{offset}=f_{ref} \cdot M$, where M is an integer value, is applied to the input 40 of the SSB mixer 36 which produces $f_{out}=f_{offset} \pm f_{channel}$ on its output 42.

In order to minimise die area and complexity, it is desirable to make use of a single VCO with 33% tuning range, for example 4,545 to 6.06 GHz, to continuously cover a 45 to 1005 MHz TV band (standard implementation). By way of example the table below lists examples of local oscillator (LO) frequencies generated by multiple dividing ratios, R. The LO freq. Max. is obtained by dividing the upper bound of the frequency (6.06 GHz in this example) by the divider ratio R and the LO freq. Min. is obtained by dividing the lower bound of the VCO frequency (4545 Mhz in this example) using a variable frequency VCO. In this example the tuning range of the VCO is computed as follows:

(6060 MHz–4545 MHz)/4545 MHz=33%

| LO divider ratio R | LO freq. Max. (MHz) | LO freq. Min (MHz |
|---|---|---|
| 6.0 | 1010 | 757.5 |
| 8.0 | 757.5 | 606 |
| 10.0 | 606 | 505 |
| 12.0 | 505 | 378.75 |
| 16.00 | 378.75 | 303 |
| 20.0 | 303 | 252.5 |
| 24.0 | 252.5 | 189.375 |
| 32.0 | 189.375 | 151.5 |
| 40.0 | 151.5 | 126.25 |
| 48.0 | 126.25 | 94.6875 |
| 64.0 | 94.6875 | 75.75 |
| 80.0 | 75.75 | 63.125 |
| 96.0 | 63.125 | 47.34375 |
| 128.0 | 47.34375 | 37.875 |

The following illustration gives an example of the problem solved by means of generating frequencies by the method in accordance with the present invention.

The example considers a dual stream application, in which stream #1 and #2 are 6 MHz bandwidth US cable streams and the stream #1 is in a "watch" mode and the stream #2 is in a "record" mode.

(1) assume the following configuration:
Stream #1 is in the watch mode: LO frequency=579.5 MHz (channel 83) implies VCO #1 frequency at 579.5*10=5795 MHz (Offset Frequency Generator (OFG) disabled).
Stream #2 is in the record mode: LO frequency=579.5 MHz (channel 116) (that is watch and record the same channel) implies VCO #2 frequency at 579.5*10=5795 MHz (OFG disabled). By having the same LO frequencies VCO #1 and VCO #2 will couple and pull together which results in exhibitions of huge spurs.

With the offset frequency synthesizer architecture the frequency plan for stream #2 could be: VCO #2=4636 MHz, offset frequency=VCO #2/4=1159 MHz. With the SSB mixer 36 (FIGS. 2 and 3) operating in an adder mode, the resulting combined frequency is 4636+1159=5795 MHz. The distance frequency between VCO #1 and VCO #2 is now equal to the offset frequency, that is 1159 MHz. This distance is so large that the VCOs will not pull the couple together.

(2) Consider now the following new configuration:
Stream #1 changed to LO frequency 771.5 MHz (channel 115) implies a VCO #1 frequency at 771.5*6=4629 MHz. Stream #2 remains unchanged VCO #2=4636 MHz, offset frequency=VCO #2/4=1159 MHz, SSB mixer 36 in added mode. In this case the frequency distance between VCO #1 and VCO #2 is 7 MHz only (+4636−4629) which will lead to VCO pulling/coupling.

With the offset frequency synthesizer architecture, the frequency plan for stream #1 could be:
VCO #1=5786.25 MHz, offset frequency=VCO #1/5=1157.25 MHz, SSB mixer 36 in subtracted mode. The resulting combined frequency is 5786.25−1157.25=4629 MHz. The distance frequency between VCO #1 and VCO #2 is now equal to 1150.25 MHz (=5786.25−4636). The distance is so large that the VCOs will not couple together.

This example explicitly shows that stream #1 with OFG always disabled and stream #2 with OFG always enabled does not allow avoiding exhibitions of spurs resulting from VCO coupling/pulling. Additionally the example shows that OFG must be adapted by changing the SSB mixer 36 mode (add or subtract) and the offset frequency value.

In accordance with the teachings of the present invention the on-demand offset frequency generation architectures and algorithms monitor the LO frequency change in a specific stream and intelligently set the frequency planning of the specific stream to maximize the distance with VCOs of other streams. This is done by adjusting on demand the offset frequency generation and the SSB mixer 36 mode.

A first embodiment of the invention, FIG. 4, provides some on-demand frequency offset generation for a dual stream reception that minimizes the number of LC-VCOs to two VCOs having identical architectures while minimizing the tuning range of the VCOs. Combined to this architecture there will be described a frequency plan algorithm that maximizes the distance between the VCOs of stream #1 and the stream #2.

A second embodiment of the invention, FIG. 6, overcomes a N-stream application (with N>2) by making use of an offset PLL and a channel PLL for each stream. Each stream uses identical offset and channel PLLs. The frequency planning of each stream is selected on-demand to maximize the distance between the VCOs.

Referring to FIG. 4, which is a more detailed view of the architecture shown in FIG. 2, the main components are the fractional-N PLL which has an input coupled to a source 18 of reference frequency $f_{ref}$, such as a crystal oscillator, and an output coupled to an on-demand offset frequency generator (OFG) 64. An output of the on-demand OFG 64 coupled to a divider 74 which provides the local oscillator frequencies to mixers (not shown).

The architecture of the fractional-N PLL is typical and comprises a LC-VCO 50 which generates the channel frequency $f_{channel}$ which is supplied to the on-demand OFG 64 and to a divider 52. A channel selection input 24 is coupled to a ΣΔ modulator 54 which generates the divider ratio (N+K) used to divide the channel frequency $f_{channel}$. In the present specification and drawings the symbol "%" is used to indicate the operation of dividing. An output from the divider 52 is supplied to a mixer 58 which also receives the reference frequency $f_{ref}$. The difference between the two frequencies is integrated in a low pass filter 62 to provide a slowly changing control voltage for the LC-VCO 50.

In the on-demand OFG 64 the channel frequency $f_{channel}$ applied to the signal paths 30, 32. The path 30 includes a two pole changeover switch 66 having one pole coupled to a quadrature generation stage 68 which in operation produces quadrature related (I, Q) versions of the channel frequency $f_{channel}$. The I and Q versions of the channel frequency are applied to an input 34 of a SSB mixer 36. The path 38 includes a divider 38 which divides the channel frequency using a divider ratio selected from a multiple divider ratio, for example P/(P+1)/(P+2), to produce the desired offset frequency $f_{offset}$ and a another quadrature generation stage 70 for producing quadrature related (I, Q) versions of the offset frequency. The I and Q versions of the offset frequency are applied to an input 40 of the SSB mixer 36. An output of the SSB mixer 36 comprises $f_{channel} \pm f_{offset}$ depending on whether the SSB mixer mode selected on-demand to be additive or subtractive. This frequency is supplied to one pole of a two pole changeover switch 72. An output of the switch 72 is coupled to the divider 74.

A second pole of the switch 66 is connected to a second pole of the switch 72. The switches 66 and 72 can be operated in a first condition in which the first poles are selected and the output signal from the on-demand OFG is $f_{channel} \pm f_{offset}$ and in a second condition in which the second poles are selected and the output frequency is $f_{channel}$.

In a receiver, there may be two on-demand frequency generators of the type shown in FIG. 4 having LC-VCOs with the same architectures and the same divider ratios R in the local oscillator dividers 74, the reference frequency $f_{ref}$ being obtained from a single reference source 18.

Reference is now made to FIGS. 5A and 5B which are a flow chart of a control algorithm to maximize the on-demand frequency distance between 2 VCOs while minimizing the VCO tuning range.

The flow chart comprises three sections, namely, sequence 76 initialization, sequence 78 to define OFG parameters and sequence 80 Enable/Disable OFG for stream #1 or #2.

Referring to sequence 76 initialization, the flow chart commences with block 82 which relates to setting the local oscillator (LO) plan for a single stream VCO: $RF_{max}$=1050 MHz, $RF_{min}$=45 MHz, $VCO_{max}$=6060 MHz, $VCO_{min}$=4545 MHz, LO divider 74 (FIG. 4) ratios $R_{1,2}$=f($LO_{1,2}$). Block 84 relates to setting: $VCO_{mid}$=($VCO_{max}$−$VCO_{min}$)/2, $Z_{min}$=($VCO_{min}$/$RF_{max}$) and $Z_{max}$=$Z_{min}$+1. Block 86 relates to setting-up LO (1) and LO (2). Block 88 relates to computing: R(1)=f(LO (1)), R(2)=f(LO2)), VCO (1)=LO(1)*R(1) and VCO (2)=LO (2)*R(2). Block 98 relates to the initial set-up of the VCO indices, for example x=1 and y=2. Once the initialization is complete the flow chart proceeds to sequence 78.

Sequence 78 is initially split into two paths. In the first of the paths the flow chart goes to block 94 in which a check is made as to whether VCO(y)>$Z_{max}$*$RF_{max}$ ? If the answer is yes (Y), then in block 96 Z=$Z_{max}$ and the flow chart continues to block 100. If the answer in block 94 is no (N) then in block 98 Z=$Z_{min}$ and the flow chart proceeds to the block 100.

In the second of the paths the flow chart goes to block 102 in which a check is made as to whether VCO(y)>$VCO_{mid}$? If the answer is yes (Y), then in block 104 Sign="+1" and the flow chart continues to block 100. If the answer in block 102 is no (N) then in block 106 Sign="−1" and the flow chart proceeds to the block 100.

In the block 100 the following are computed:

$VCO_{OFG}$=VCO(y)·(1+Sign/X), $P_{OFG}$=VCO(y)/Z d1=abs[VCO(x)−VCO(y)]

d2=abs[VCO(x)−$VCO_{OFG}$].

The flow chart now proceeds to the sequence 80.

In sequence 80, block 108 relates to checking whether d2>d1? If the answer is yes (Y) then in block 110 the following updates are effected: Enable OFG(y), Set freq. VCO(y)=$VCO_{OFG}$, and Set P(y)=$P_{OFG}$. Alternatively if the answer is No (N) then the following updates are effected: Disable OFG(y), Set freq. VCO(y)=VCO(y), and Set R(y). In block 114 a check is made as to whether a change request has been received for LO(1) or LO(2)? If the answer is no (N) the loop returns to the input of the block 114. If the answer is yes (Y) then in block 116 a check if a change request for LO(2) has been made? If the answer is yes (Y) then in block 118 x=1, y=2 is set up and the flow chart reverts to the beginning of the sequence 78. Alternatively if the answer is no (N) then in block 120 y=1, x=2 is set and the flow chart reverts to the beginning of the sequence 78.

The following table relates to the combined architecture and algorithm results when $f_{ref}$=16 MHz and compares using a multiple divider ratio 4/5/6 instead of 3/5:

| Offset divider scheme | Parameters | Unit | Min | Max |
| --- | --- | --- | --- | --- |
| 4/5/6 | Channel freq. | MHz | 4246 | 6358 |
|  | Offset freq. | MHz | 1009 | 1256 |
|  | Distance between VCOs | MHz | 507 | 1809 |
| 3/5 | Channel freq. | MHz | 3981 | 6622 |
|  | Offset freq. | MHz | 1137 | 1510 |
|  | Distance between VCOs | MHz | 569 | 2074 |

The use of the multiple divider ratio 4/5/6 enables to reduce the VCO tuning range from 66.4% to 49.7%, to maintain the offset frequency value >1005 MHz to avoid leakage in the 45 to 1005 MHz TV bands and to maximize the distance between the VCOs to a minimum of 507 MHz.

Reverting to FIGS. 5A and 5B, it is worth noting that only the channel selection of stream #1 and stream #2 can change the frequency plans. Since this information is available in software, the proposed algorithm can be implemented in software and neither requires any specific protocol nor specific hardware between the TV receiver that demodulates stream #1 and the TV receiver that demodulates stream #2.

However a potential drawback with the embodiment shown in FIG. 4 is that it may suffer from spurs and noise correlation between offset frequency generation and channel frequency generation which can seriously degrade both the noise and spurs magnitude after recombination at the SSB mixer 36 (FIG. 4) output.

FIG. 6 illustrates an embodiment that overcomes the potential problems mentioned above and enables the number of simultaneous multi-stream reception to at least 8. The illustrated architecture develops the architecture shown in FIG. 3 and has the on-demand ability to set at least 8 different frequency plans to handle simultaneously 8 streams as shown in the following table which relates to the minimum frequency distance between channel VCOs when $f_{ref}$=16 MHz:

| Distance between VCOs | 2 streams | 4 streams | 8 streams |
| --- | --- | --- | --- |
| Min.[MHz] = Min (Δ $VCO_{offset}$)/4 | 628 | 60 | 20 |

In FIG. 6 the offset frequency is generated by a separate PLL 44 rather obtained by division from the channel frequency. The source 18 of reference frequency $f_{ref}$ is connected to an input 22 of the frequency generating means. A fractional-N channel PLL is connected to the input 22 and generates the channel frequency $f_{channel}$ which is supplied to the switching contact of a 2 pole changeover switch 66. One of the poles is coupled through a RC-CR filter network 122 which produces quadrature related versions I and Q of the channel frequency and supplies them to a limiter 124 which in turn is coupled to an input 34 of a SSB mixer 36.

The reference frequency $f_{ref}$ is supplied to an integer-N offset PLL 44 which has an input 126 for $N_{offset}$ having a set range [126, 157]. An output from the PLL 44 is coupled to a divide-by-2 divider 128 which provides quadrature related versions Q and I of the offset frequency which are applied to input 40 of the SSB mixer 36. The output of the SSB mixer 36 comprises $f_{channel} \pm f_{offset}$ depending on whether it is operating in an additive or subtractive mode. This output is applied to one pole of another two pole changeover switch 72. The second pole of the switch 72 is coupled to a second pole of the switch 66. The switching contact of the switch 72 is coupled to a divider 74 which produces the local oscillator frequency to be supplied to the mixers (not shown).

By implementing the OFG as an offset PLL, spurs and noise of the offset frequency and the channel frequency are uncorrelated. The added or subtracted mode selection in the SSB mixer 36 is defined and set on-demand in a manner similar to that described in the previous embodiment (FIGS. 4 and 5). Unlike the previous embodiment in which the offset frequency was changing according to the channel frequency, the offset frequency is fixed.

The following table illustrates an 8 frequency plan used for multi-stream configuration (Up to 8 streams are shown). It is worth noting that in order to maximize frequency distance between channel VCOs, all these frequencies plan can be sent to stream #N when a channel change is requested on stream #N (where N=1, 2, ... 8), the frequency step for the offset PLL is 16 MHz:

| Freq. plan | A | B | C | D | E | F | G | H |
|---|---|---|---|---|---|---|---|---|
| VCO$_{offset}$ freq. [MHz] | 0 | 2512 | 2272 | 2016 | 2432 | 2352 | 2176 | 2096 |
| VCO$_{channel}$ [MHz] | 4545 | 3999 | 4119 | 4247 | 4039 | 4079 | 4167 | 4207 |
| TR [MHz] | 6060 | 6497 | 6377 | 6249 | 6457 | 6417 | 6329 | 6289 |
| 2 streams | x | x | | | | | | |
| 4 streams | x | x | x | x | | | | |
| 8 streams | x | x | x | x | x | x | x | x |

Based on experience, the minimum distance between VCOs should be greater than 30 MHz to avoid pulling between VCOs. It has been found that the method in accordance with the present invention enables 4 streams to be received simultaneously on the same die without being de-sensed by VCOs pulling.

The on-demand frequency plan computation for quad-stream reception will now be illustrated.
  Initial Conditions:
  Enter the channel number per stream in the following:
  Rk: channel number [1, 2, ..., 161] and are spaced by 6 MHz
  Corresponding RF frequency: 45.5*[1-(channel number-1)]*6 MHz
  Stream #1=>channel [20] ? 20
  Stream #2=>channel [10] ? 10
  Stream #3=>channel [125] ? 125
  Stream #3=>channel [161] ? 161
  stream_result=
  stream #1=>freq.plan:A/VCO.freq=5104 MHz
  stream #2=>freq.plan:B/VCO.freq=6032 MHz
  stream #3=>freq.plan:A/VCO.freq=4737 MHz
  stream #4=>freq.plan:C/VCO.freq=4897 MHz
  frequency_distance_between_VCOs=
  VCO#1:VCO#2=928 MHz
  VCO#1:VCO#3=367 MHz
  VCO#2:VCO#3=1295 MHz
  VCO#1:VCO#4=207 MHz
  VCO#2:VCO#4=1135 MHz
  VCO#3:VCO#4=160 MHz
  LO frequency change on a specific stream?
  yes or no ? (yes=>1, no=>0) [1] ? 1
  Stream #1, 2, 3, 4 to update [1] ? 2
  New Channel index [100] ? 25
  stream_result=
  stream #1=>freq.plan:A/VCO.freq=5104 MHz
  stream #2=>freq.plan:B/VCO.freq=5804 MHz
  stream #3=>freq.plan:A/VCO.freq=4737 MHz
  stream #4=>freq.plan:C/VCO.freq=4897 MHz
  freq_dist_between_VCO=
  VCO#1:VCO#2=700 MHz
  VCO#1:VCO#3=367 MHz
  VCO#2:VCO#3=1067 MHz
  VCO#1:VCO#4=207 MHz
  VCO#2:VCO#4=907 MHz
  VCO#3:VCO#4=160 MHz.

FIG. 7 is a block schematic diagram of an arrangement of two receivers Rx1 and Rx2 on a single die. A single antenna 130 or cable TV modem 131 is coupled to a low noise amplifier LNA. The signal path from the low noise amplifier LNA is fed to two channel splitters SPL1, SPL2. Each of the channel splitters split their respective input path into quadrature related paths I, Q. Each of the quadrature related paths is coupled to a respective mixer 132, 134, 136, 138.

A single reference source having a frequency $f_{ref}$ is coupled to respective on-demand offset frequency generators 140 142 having identical architectures and being constructed and arranged to operate as described with reference to any one of FIGS. 2, 3, 4 and 6. The products of mixing from the mixers 132, 134 and 136, 138 are supplied to respective intermediate frequency and decoding stages 144, 146 for recovering the baseband data contained in the signals as received.

In the present specification and claims the word "a" or "an" preceding an element does not exclude the presence of a plurality of such elements. Further, the word "comprising" does not exclude the presence of other elements or steps than those listed.

The use of any reference signs placed between parentheses in the claims shall not be construed as limiting the scope of the claims.

From reading the present disclosure, other modifications will be apparent to persons skilled in the art. Such modifications may involve other features which are already known in the design, manufacture and use of on-demand frequency generators and components therefor and which may be used instead of or in addition to features already described herein.

The invention claimed is:

1. A method of operating a multi-stream reception scheme involving at least two streams comprising at least two receivers having respective voltage controlled oscillators (VCOs), the method comprising:
  selecting one of the at least two streams;
  monitoring a change in local oscillator frequency in the selected stream;
  if a frequency distance between the local oscillator frequencies of the at least two streams is below a value likely to cause one of pulling and coupling between the VCOs of the at least two receivers, resetting a frequency planning of the monitored stream to maximize the frequency distance of the VCO of the monitored stream with the VCOs of unselected streams using both a fractional-N PLL and an integer-N PLL; and
supplying a reference frequency simultaneously to both the fractional-N PLL and the integer-N PLL.

2. The method as claimed in claim 1, further comprising:
generating a first RF frequency by a first VCO;
generating a second RF frequency by a second VCO; and
resetting a VCO frequency of the monitored stream to another frequency that maximizes the frequency distance when the frequency distance is below the value.

3. The method as claimed in claim 1, further comprising:
generating a first RF frequency by a first VCO;
generating a second RF frequency by a second VCO;
resetting the VCO frequency of the monitored stream to another frequency to produce an offset frequency when the frequency distance is below the value; and
combining the another frequency and the offset frequency to provide the VCO frequency of the monitored stream.

4. The method as claimed in claim 3, further comprising:
producing the offset frequency by dividing the another frequency.

5. The method as claimed in claim 3, further comprising:
producing the offset frequency by a separate phase locked loop from a phase locked loop used to produce the another frequency; and
using a common reference frequency source to produce both the another frequency and the offset frequency.

6. An apparatus suitable for operating a multi-stream reception scheme involving at least two streams, the apparatus comprising
at least two receivers having respective voltage controlled oscillators (VCOs); and
a device configured to monitor a change in local oscillator frequency in a selected one of the at least two streams and, if a frequency distance between the local oscillator frequencies of the streams is below a value likely to cause one of pulling and coupling between the VCOs of the at least two receivers, configured to reset a frequency planning of the monitored stream to maximize the frequency distance of the VCO of the monitored stream with the VCOs of unselected streams using both a fractional-N PLL and an integer-N PLL, wherein a reference frequency is supplied simultaneously to both the fractional-N PLL and the integer-N PLL.

7. The apparatus as claimed in claim 6, wherein a first RF frequency is generated by a first VCO, a second RF frequency is generated by a second VCO, and a VCO frequency of the monitored stream is reset to another frequency maximizing the frequency distance when the frequency distance is below the value.

8. The apparatus as claimed in claim 6, wherein a first RF frequency is generated by a first VCO, a second RF frequency is generated by a second said VCO, a VCO frequency of the monitored stream is reset to another frequency to produce an offset frequency when the frequency distance is below the value, and the another frequency and the offset frequency are combined to provide the VCO frequency of the monitored stream.

9. The apparatus as claimed in claim 8, further comprising:
a frequency divider configured to divide the another frequency.

10. The apparatus as claimed in claim 8, further comprising:
a separate phase locked loop configured to produce the offset frequency, wherein a common reference frequency source is used to produce both the another frequency and the offset frequency.

11. A multi-stream reception system in which transmissions are made on at least one of a plurality of streams having predetermined channel frequencies, the system comprising:
at least one receiving device having a plurality of simultaneously operating receivers coupled to a common reference signal source, a first receiver of the plurality of the receivers having, for a first stream,
a first device configured to set a frequency of a first voltage controlled oscillator (VCO) to a value which can be used to produce a first local oscillator frequency for demodulating the channel frequency of the first stream, and a second receiver of the plurality of the receivers having, for a second stream,
a second device configured to set a frequency of a second voltage controlled oscillator (VCO) to a value which can be used to produce a second local oscillator frequency for demodulating another one of the channel frequencies, the receiving device having
a device configured to monitor a local oscillator frequency change between the first local oscillator frequency and the second local oscillator signal and determine if the change in frequency is likely to cause the second VCO to interfere with the first VCO, and, in response to determining that there is a risk of interference, reset the second VCO frequency to maximize a frequency distance with at least the first VCO using both a fractional-N PLL and an integer-N PLL, wherein a reference frequency is supplied simultaneously to both the fractional-N PLL and the integer-N PLL.

12. The system as claimed in claim 11, wherein the second VCO frequency is reset using an offset frequency generator whose offset frequency is combined with a channel frequency.

13. The system as claimed in claim 12, wherein the second VCO generates the channel frequency using a phase locked loop (PLL) coupled to the common reference frequency source, in that the offset frequency generator comprises a device configured to divide the channel frequency to obtain an offset frequency, and combine the offset frequency with the channel frequency.

14. The system as claimed in claim 12, wherein the second VCO generates the channel frequency using the fractional-N PLL coupled to the common reference frequency source, in that the offset frequency generator comprises a second phase locked loop for generating an offset frequency, the integer-N PLL being coupled to the common reference frequency source, and combining the offset frequency with the channel frequency to form an output frequency.

15. The system as claimed in claim 14, wherein a divider is provided to divide the output frequency to obtain the local oscillator frequency.

16. The method of claim 1, wherein each stream has an offset PLL and a channel PLL.

17. The method of claim 16, wherein each stream uses identical offset and channel PLLs.

18. The method of claim 1, further comprising:
generating a channel frequency with the fractional-N PLL; and
supplying the generated frequency to a two-pole changeover switch.

19. The method as claimed in claim 3, further comprising:
producing the offset frequency by a separate phase locked loop from a phase locked loop used to produce the another frequency.

20. The apparatus as claimed in claim 6, further comprising:
a separate phase locked loop configured to produce the offset frequency.

* * * * *